United States Patent [19]

Gates et al.

[11] 3,970,819
[45] July 20, 1976

[54] BACKSIDE LASER DICING SYSTEM

[75] Inventors: Gerald Alan Gates; William John Ryan, both of Jericho, Vt.

[73] Assignee: International Business Machines Corporation, Armonk, N.Y.

[22] Filed: Nov. 25, 1974

[21] Appl. No.: 526,988

[52] U.S. Cl. .................. 219/121 LM; 29/576 T; 29/583
[51] Int. Cl.² ........................................ B23K 26/00
[58] Field of Search... 219/121 L, 121 LM, 121 EB, 219/121 EM; 29/569, 576, 580, 582, 583, 203 R, 412, 413; 83/6; 225/1, 2, 93.5, 96, 96.5

[56] References Cited
UNITED STATES PATENTS

| | | | |
|---|---|---|---|
| 3,112,850 | 12/1963 | Garibotti | 225/2 |
| 3,453,097 | 7/1969 | Häfner | 219/121 LM X |
| 3,610,871 | 10/1971 | Lumley | 219/121 LM |
| 3,695,498 | 10/1972 | Dear | 225/1 |
| 3,790,744 | 2/1974 | Bowen | 219/121 LM |
| 3,800,991 | 4/1974 | Grove et al. | 225/2 |
| 3,816,700 | 6/1974 | Weiner et al. | 219/121 L |
| 3,824,678 | 7/1974 | Harris et al. | 29/578 |

OTHER PUBLICATIONS

"Lasers in Industry," by Gagliano et al., *Proceedings of the IEEE*, vol. 57, No. 2 Feb. 1969, pp. 133-134.

*Primary Examiner*—J. V. Truhe
*Assistant Examiner*—G. R. Peterson
*Attorney, Agent, or Firm*—Francis J. Thornton

[57] ABSTRACT

A wafer of semiconductor material having a plurality of units defined on its face is subdivided by treating the wafer, on its back or reverse side, in the kerf regions between the units, where division of the units is desired, such that the material of the wafer in the treated kerf regions is converted to a material having a breaking strength lower than the breaking strength of the semiconductor material.

8 Claims, 4 Drawing Figures

BACKSIDE LASER DICING SYSTEM

BACKGROUND OF THE INVENTION

1. Field of the Invention

This invention relates generally to a process for dicing semiconductor wafers into individual units and more particularly to a process for dicing such wafers from the backside thereof so that contamination of the face of the unit by the dicing operation is avoided.

2. Description of the Prior Art

Many mechanical methods of structurally weakening semiconductor wafers such that they will fracture on predetermined planes are known to prior art. Such methods include sawing, sandblasting and scribing with a diamond point.

Additionally, U.S. Pat. No. 3,816,700 discusses laser scribing, i.e., cutting partially through a semiconductor wafer with a laser beam and applying mechanical stresses to the material to break it into individual dice. Such wafers have active devices or integrated circuits formed in their face or front surface.

When a laser beam is so directed at this front surface a trench or scribe work caused by evaporation of the wafer material is formed. The material evaporated from the trench resolidifies on the face of the body contaminating the circuits on the face of the body. Additionally, this resolidified material or slag can build upon each side of the body such that ridges of slag are formed which ridges are high enough to interfere with subsequent testing and bonding of the units in the wafer.

U.S. Pat. No. 3,824,678 teaches the dicing of beam lead circuits by evaporating away about 90 percent of the semiconductor wafer with a laser beam directed at the backside of the wafer.

This patent avoids the problem of contamination being deposited on the face of the wafer. However, because the wafer is not completely cut through it is necessary to break the uncut silicon and this breakage of the uncut silicon because of the crystallographic orientation of the silicon can cause cracks to propagate into the circuits created on the face of the semiconductor wafer. Also, such uneven breakage of the silicon leaves sharp shards extending from the edge of the dice which shards will interfere with subsequent handling of the units.

To overcome these disadvantages a dicing operation is preferred that will provide separate units from a semiconductor wafer while avoiding surface contamination and handling problems associated with the prior art. The present invention provides such dicing operation.

SUMMARY OF THE INVENTION

Broadly speaking the present invention comprises a process in which semiconductor wafers are diced by applying to the backside of the wafer a laser beam to render the thickness of the wafer in the area treated by the laser beam into a non-crystalline material having a breaking strength less than the breaking strength of the original wafer starting material.

The semiconductor wafer is treated by the laser beam focused on its backside which has been previously positioned relative to a desired set of coordinates such that the laser beam will treat only the kerf areas between the units to be diced from the wafer. After treatment the semiconductor wafer is broken into chips and separated.

In the preferred embodiment, the laser beam renders substantially all of the thickness of the wafer in the area under the beam molten which molten region is permitted to resolidify into a non-crystalline material having a breaking strength less than the breaking strength of the original wafer material.

Thus, it is an object of the invention to provide an improved process for dividing a wafer of single crystal semiconductor material by using a laser beam for converting the single crystal material, in the kerf regions, into a material having a lower breaking strength.

Another object of the invention is to provide a process for producing semiconductor devices diced from a wafer of semiconductor crystal material in which contamination of the face of the wafer containing the units is voided. Still another object of the invention is to provide a laser dicing process in which the dice created by the process is provided with edges substantially perpendicular to the face of the unit.

Still another object of the invention is to set the wafer into condition for easy separation while preventing premature movement of the individual dice with respect to the reaminder of the wafer before the wafer is deliberately broken into individual dice.

These and other objects and features of the present invention will become more apparent when taken in connection with the following description of the drawings wherein FIG. 1 illustrates a wafer of semiconductor material being diced by a laser beam.

DESCRIPTION OF THE PREFERRED EMBODIMENT

Briefly, the invention concerns a method for forming a plurality of semiconductor dice from a large wafer of semiconductor material. Such a wafer, usually circular in shape, is cleaned and treated with a laser beam by passing the beam on a first series of parallel lines and then passing the beam along a second series of parallel lines which are right angles to the first series of lines in order to define a plurality of rectangular or square dice of desired size. The laser treated wafer is then placed on a resilient pad which is in turn mounted on a supporting cover over which a pressure roll moves. The resiliency of the pad together with the diameter and weight of the roller and a predetermined pressure therethrough are all related to the size of the units to be diced. The treated semiconductor wafer is rolled first with the roller axis parallel to one set of scribed lines and then rolled again with the roller axis parallel to the other set of scribed lines to break the slab into individual dice.

Figure 2:
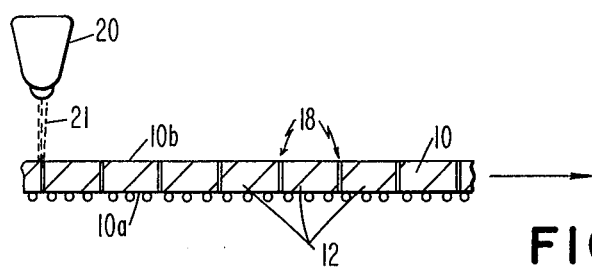
FIG. 2 shows an enlarged portion of the laser treating the wafer from the backside therof.
Figure 3:
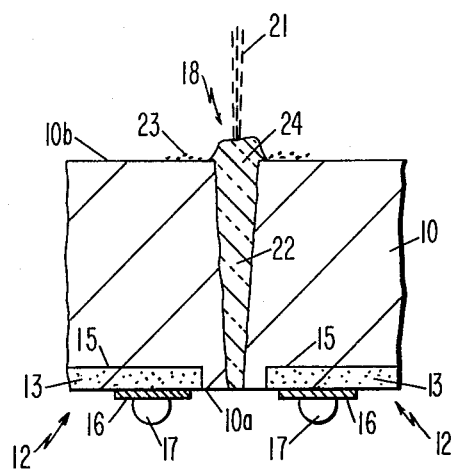
FIG. 3 shows a greatly enlarged view of the effect of the laser impinging on the kerf area of the individual units.

Referring now to the figures and especially FIGS. 1, 2, and 3 there is shown a semiconductor wafer 10 of any suitable semiconductor material, for example, silicon, having formed below its first surface 10a a plurality of individual semiconductor devices 12. Typically in such semiconductor wafers each device 12 is identical to any other device and each device 12 may be for example, a diode or a transistor or an integrated circuit. Each of these devices 12 may for example be comprised at least in part of a diffusion 13, shown in FIG. 3, which produces in the body of semiconductor material a P-N junction 15 and a plurality of contact pads 16 contacting the diffiusions 13. Disposed on each of these contact pads are solder balls 17 which serve to contact external wiring (not shown).

Figure 1:
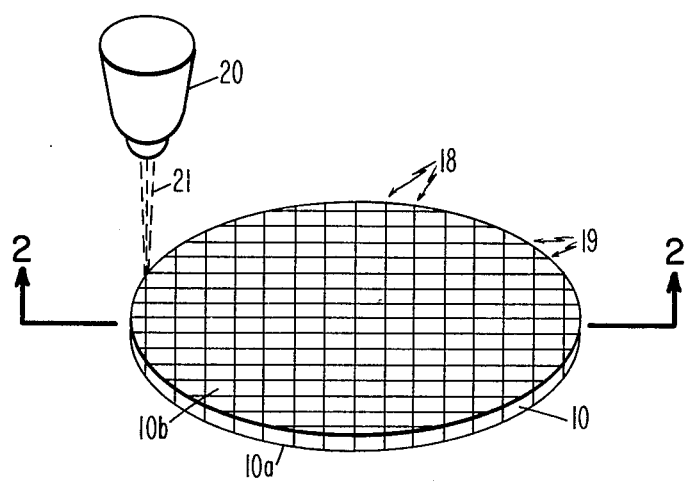

These devices are usually formed in the semiconductor wafer such that mutually orthogonal spaces or kerf regions indicated in FIG. 1 by lines 18 and 19 are defined between each of the devices 12.

In the present invention it is modification of this kerf region and conversion of the material in this kerf region into a material of lower breaking strength material that permits the advantages of the invention to be realized. The wafer 10 is positioned under a laser apparatus 20 such that a laser beam 21 being emitted by the laser 20 will impinge on the lines 18 and 19 as the wafer is passed first in one direction under the laser beam and then at right angles thereto. Thus the wafer 10 is mounted for slidable movement with respect to the laser beam such that the beam first passes along the lines 18 and then orthogonal thereto along the lines 19. The wafer 10 is positioned such that the laser beam 21, shown in FIG. 1, will impinge upon the back surface 10b of wafer 10, which surface 10b is the back surface opposite to the front surface 10a in which the active diffisions have been produced.

Typically, to achieve the correct alignment of the wafer with the beam, the wafer would be calibrated into a desired position on $x$ $y$ positioning table set at a reference set of coordinates. After being so positioned the positioning table would be programmed to move at a certain rate along certain coordinates to move the wafer under the laser beam such that the beam passes along the lines 18 and 19. In a preferred embodiment the wafer is positioned by utilizing the apparatus taught in a co-pending U.S. Pat. application Ser. No. 526,989 entitled Semiconductor Wafer Alignment Apparatus, filed in the name of Gerald Gates, assigned to the same assignee of the present invention and filed of even date herewith. As described in this co-pending application the semiconductor wafer is viewed through a split image microscope and positioned with respect to a set of alignment marks. After the wafer has been positioned it is inverted while retaining the aligned positioned and transferred on an $x$ $y$ movable table under a laser beam. The $x$ $y$ movable table is programmed such that the laser beam 21 will pass along the kerf regions 18 and then pass along the kerf regions 19.

When the wafer 10 is silicon and nominally 0.0155 inches thick the laser beam 21 impinging on the semiconductor is preferrably about 0.002 inches in diameter, and is pulsed at 12.5 KC with an average power of 16 watts in the third order mode. Such a beam is derived from a yittrium aluminum garnet niobium doped, continuous laser. When this laser beam having the described power and repetition rate is beamed against the semiconductor wafer through a 48 mm objective lens and pulsed 25 times in the same spot while the wafer is passing under the beam at the rate of 1 inch per second a column of the semiconductor material in the kerf region 18, shown in FIG. 3, is converted into silicon dioxide 22. This column of silicon dioxide 22 becomes progressively narrower in cross section as it extends through the semiconductor wafer. For the 0.0155 nominally thick wafer the column 22 at the surface 10b is approximately 0.002 inches wide and at the surface 10b is about 0.001 inches wide. This silicon dioxide column 22 is formed as the laser beam 21 impinges on the silicon body 10. The silicon is made molten by the beam and combines with the oxygen in the air to form the column 22. As the column 22 forms by the introduction of the oxygen into the molten silicon the column 22 expands and protruding forms a lip 24 which extends above the surface 10b.

Because the laser beam 21 impinges on the surface 10b which is opposite to the surface 10a, containing the active devices, any debris 23 or protrusions 24 formed on the back surface 10b will have no effect on the active devices. Once the laser beam 21 has converted all the material in the kerf region into an oxide the wafer can be broken into individual chips.

Figure 4:
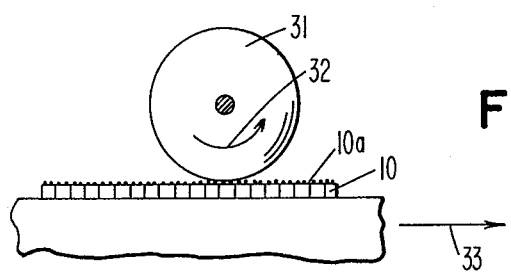
FIG. 4 illustrates the breaking of the treated wafer into individual dice.

Methods and apparatus for breaking such semiconductor wafers into individual chips are well known to persons skilled in the art. Typically, the wafer, after treatment by the laser beam, is placed on a resilient pad 30 with its active surface 10a again exposed. A cylindrical roller 31 rotating in a clockwise direction, indicted by arrow 32, is permitted to come in contact with the uppermost surface 10a of the semiconductor body 10 while the resilient pad 30 is being drawn in the direction of arrow 33. To break the entire wafer into individual chips the wafer 10 is first placed on the resilient pad 30 such that one set of parallel lines 18 is parallel to the axis of the cylinder 31 and then the entire pad and wafer is turned 90° so that the cylinder will now roll across the wafer in the direction substantially parallel to the other set of parallel lines 19. Because the silicon dioxide regions 22 created in the body by the action of the laser beam is amphorous and non-crystalline it has a breaking strength substantially lower than the breaking strength of the original crystalline silicon wafer material. Thus, the roller 31 shown in FIG. 4 is adjusted such that the forces applied to the semiconductor wafer 10 will cause the created non-crystalline column 22 to break while the unconverted crystalline semiconductor material is unaffected.

After the unit has been separated individual chips can be removed very easily by means of a vacuum probe (not shown).

Thus there has been described a method of laser dicing a silicon wafer from the backside which eliminates contamination of the front surface by debris from the laser dicing step. The invention, as described, also provides a substantially vertical edge, i.e. less than 2° from the vertical and eliminates any angular shards on the dice such as were created in prior art dicing operations.

Because no debris are created on the front surface of the active device the present invention does not require the cleaning steps which were necessary with prior art dicing apparatus.

It should be noted that although rectangular dice have been described that the present process could also be used to produce circular, hexagonal, or other configurations not requiring parallel or orthogonal lines.

Although a preferred process has been described herein it should be obvious to those skilled in the art that the invention may be carried out in various ways and may take various forms of embodiments other than those described above. Accordingly, it is understood that the present invention is not limited by the details of the foregoing description but is defined by the following claims.

I claim:

1. A process for breaking along predetermined lines a wafer of single crystal material having a given thickness and selected breaking strength comprising the steps of, applying a laser beam along said lines, said laser beam having an intensity sufficient to convert all the thickness of the wafer along said lines into a continuous non-crystalline material extending through the thickness of the wafer and having a breaking strength less than the breaking strength of the single crystal material, converting a portion of said wafer extending through said given thickness and defined by said lines into said non-crystalline material, removing said beam, and separating the wafer into individual units by applying a force to said wafer sufficient to exceed the breaking strength of the non-crystalline material but insufficient to break the crystalline material.

2. The process of claim 1 wherein said wafer of single crystal material is comprised of silicon.

3. The process of claim 2 wherein said non-crystalline material comprises silicon dioxide.

4. the process of claim 1 wherein said wafer of single crystal material is comprised of semiconductor material and has first and second major surfaces with a plurality of integrated circuits separated by kerf areas disposed on said first surface, and said laser beam is applied to said second surface and in said kerf areas.

5. The process of claim 1 wherein said laser beam is derived from a yittrium aluminum garnet, niobium doped continuous laser having an average power of 16 watts in the third order mode.

6. The process of claim 5 wherein said laser beam is pulsed at 12.5 KC.

7. The process of claim 1 wherein said laser beam is applied along said lines by mounting the wafer on a movable table under said beam and moving said table under said beam.

8. The process of claim 7 wherein said wafer is moved under said laser beam at the rate of 1 inch per second.

* * * * *